United States Patent
No et al.

(10) Patent No.: US 8,347,194 B2
(45) Date of Patent: Jan. 1, 2013

(54) HIERARCHICAL DECODING APPARATUS

(75) Inventors: Jong Seon No, Seoul (KR); Beom Kyu Shin, Seoul (KR); Seok Il Youn, Seoul (KR); Jae Dong Yang, Seoul (KR); Jun Jin Kong, Yongin-si (KR); Jae Hong Kim, Seoul (KR); Yong June Kim, Seoul (KR); Kyoung Lae Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 883 days.

(21) Appl. No.: 12/428,511

(22) Filed: Apr. 23, 2009

(65) Prior Publication Data
US 2009/0282319 A1 Nov. 12, 2009

(30) Foreign Application Priority Data
May 9, 2008 (KR) .................. 10-2008-0043149

(51) Int. Cl.
*G06F 11/00* (2006.01)
(52) U.S. Cl. ...................................... 714/785; 714/784
(58) Field of Classification Search .................. 714/785, 714/783, 784, 780, 759
See application file for complete search history.

(56) References Cited

U.S. PATENT DOCUMENTS

| 6,553,536 | B1 * | 4/2003 | Hassner et al. | 714/780 |
| 6,738,941 | B1 * | 5/2004 | Todoroki | 714/755 |
| 7,633,829 | B2 * | 12/2009 | Fasoli et al. | 365/230.06 |
| 2006/0136799 | A1 | 6/2006 | Choi et al. | |

FOREIGN PATENT DOCUMENTS

| KR | 1020050045470 A | 5/2005 |
| KR | 1020060068168 A | 6/2006 |
| KR | 1020070073949 A | 7/2007 |

* cited by examiner

*Primary Examiner* — Dieu-Minh Le
(74) *Attorney, Agent, or Firm* — Volentine & Whitt, PLLC

(57) ABSTRACT

A decoder includes multiple decoder stages and a controller. The decoder stages perform decoding operations with respect to a received signal using corresponding different decoding algorithms. The controller determines whether the decoding operation performed by one of the decoder stages with respect to the received signal is successful, and controls the decoding operation of each of the other decoder stages in response to a result of the determination.

27 Claims, 8 Drawing Sheets

HIERARCHICAL DECODING APPARATUS

PRIORITY CLAIM

A claim of priority is made to Korean Patent Application No. 10-2008-0043149, filed on May 9, 2008, in the Korean Intellectual Property Office, the subject matter of which is hereby incorporated by reference.

SUMMARY

Embodiments of the present invention relate to error correction, and more particularly, to a decoding apparatus capable of hierarchically applying a variety of decoding algorithms.

There are a variety of types of decoding algorithms. A simple decoding algorithm has a relatively low computational complexity, and may be used in a decoding process to satisfy a required bit error rate (BER) when a channel environment is good. However, when the channel environment is poor, the simple decoding algorithm may not satisfy the required BER. In comparison, a complex decoding algorithm having a relatively high computational complexity may satisfy the required BER when the channel environment is good or poor, but the complex decoding process requires additional processing and power consumption, and increases latency, due to the complex computations. For example, a sum-product algorithm used as a decoding algorithm requires extensive computation, and is therefore disadvantageous in spite of superior BER performance. Thus, a trade-off exists between the computational complexity and the BER of a received signal after the decoding process.

Embodiments of the present invention provide a decoding apparatus that reduces processing, decoding latency and power consumption by applying at least one of a variety of decoding algorithms according to BER when a received signal has a variety of BERs.

According to an aspect of the invention, there is provided a decoder including multiple decoder stages and a controller. The decoder stages perform decoding operations with respect to a received signal using corresponding different decoding algorithms. The controller determines whether the decoding operation performed by one of the decoder stages with respect to the received signal is successful, and controls the decoding operation of each of the other decoder stages in response to a result of the determination.

The controller may calculate a syndrome value with respect to a signal decoded by the one decoder stage, determine whether the decoding operation is successful based on the calculated syndrome value, and control the decoding operation of each of the other decoder stages based on a result of the determination.

According to another aspect of the invention, there is provided a decoder including multiple decoder stages, a demultiplexer, a multiplexer and a controller. The decoder stages perform respective decoding operations with respect to a received signal using corresponding decoding algorithms different from one another. The demultiplexer sends the received signal to one decoder stage of the decoder stages in response to a first selection signal. The multiplexer sends an output signal of the one decoder stage in response to a second selection signal. The controller determines, in response to the output signal of the multiplexer, whether the decoding operation of the one decoder stage with respect to the received signal is successful, and generates the first and second selection signals based on a result of the determination.

The decoder may further include a buffer for storing the received signal and sending the stored received signal to the demultiplexer in response to a control signal generated based on the determination result of the controller. The controller may calculate a syndrome value with respect to the output signal of the multiplexer, determine whether the decoding operation of the one decoder stage is successful based on the calculated syndrome value, and control the decoding operation of each of the other decoder stages based on a result of the determination.

According to another aspect of the invention, there is provided a decoder including a controller and N decoder stages, where N is a natural number. The controller estimates a state of a channel through which a received signal is sent. Each decoder stage performs a decoding operation with respect to the received signal using a decoding algorithm different from decoding algorithms of another decoder stage. The controller controls the decoding operation of each of the decoder stages based on the estimated state of the channel. The controller may estimate the state of the channel based on a bit error rate (BER) of the received signal and/or distribution of memory cells stored in a flash memory device.

According to another aspect of the invention, there is provided a decoder including a controller and first and second decoder stages. The controller estimates a state of a channel through which a received signal is sent. The first decoder stage performs a decoding operation with respect to the received signal using a first decoding algorithm. The second decoder stage performs a decoding operation with respect to the received signal using a second decoding algorithm. The controller controls the decoding operation of each of the first and second decoder stages based on an estimated state of the channel.

The controller may control whether the decoding operation of the second decoder stage is performed, according to whether the decoding operation performed by the first decoder stage with respect to the received signal is successful. A computational complexity of the first decoding algorithm may be lower than a computational complexity of the second decoding algorithm.

According to another aspect of the invention, there is provided a decoder including a soft decision level determination circuit, a controller and N decoder stages, where N is a natural number. The soft decision level determination circuit determines a soft decision level, in response to a control signal, with respect to a received signal input through a channel and outputs soft decision values according to a result of the determination. The controller generates the control signal and to estimate a state of the channel based on the soft decision values. The N decoder stages perform decoding operations with respect to the soft decision values, respectively using decoding algorithms different from one another. The controller controls the decoding operations of the N decoder stages based on the estimated state of the channel.

According to another aspect of the invention, there is provided a decoder including a soft decision level determination circuit, a controller, and first and second decoder stages. The soft decision level determination circuit determines a soft determination level with respect to a received signal input through a channel and outputs soft decision values according to a result of the determination, in response to a control signal. The controller generates the control signal and estimates a state of the channel based on the soft decision values. The first decoder stage performs a decoding operation with respect to the soft decision values using a first decoding algorithm, and the second decoder stage performs a decoding operation with respect to the soft decision values using a second decoding algorithm. The controller controls the decoding operation of each of the first and second decoder stages based on the estimated state of the channel.

BRIEF DESCRIPTION OF THE DRAWINGS

Exemplary embodiments of the present invention will be described with reference to the attached drawings, in which.

DETAILED DESCRIPTION OF THE EMBODIMENTS

Figure 1:
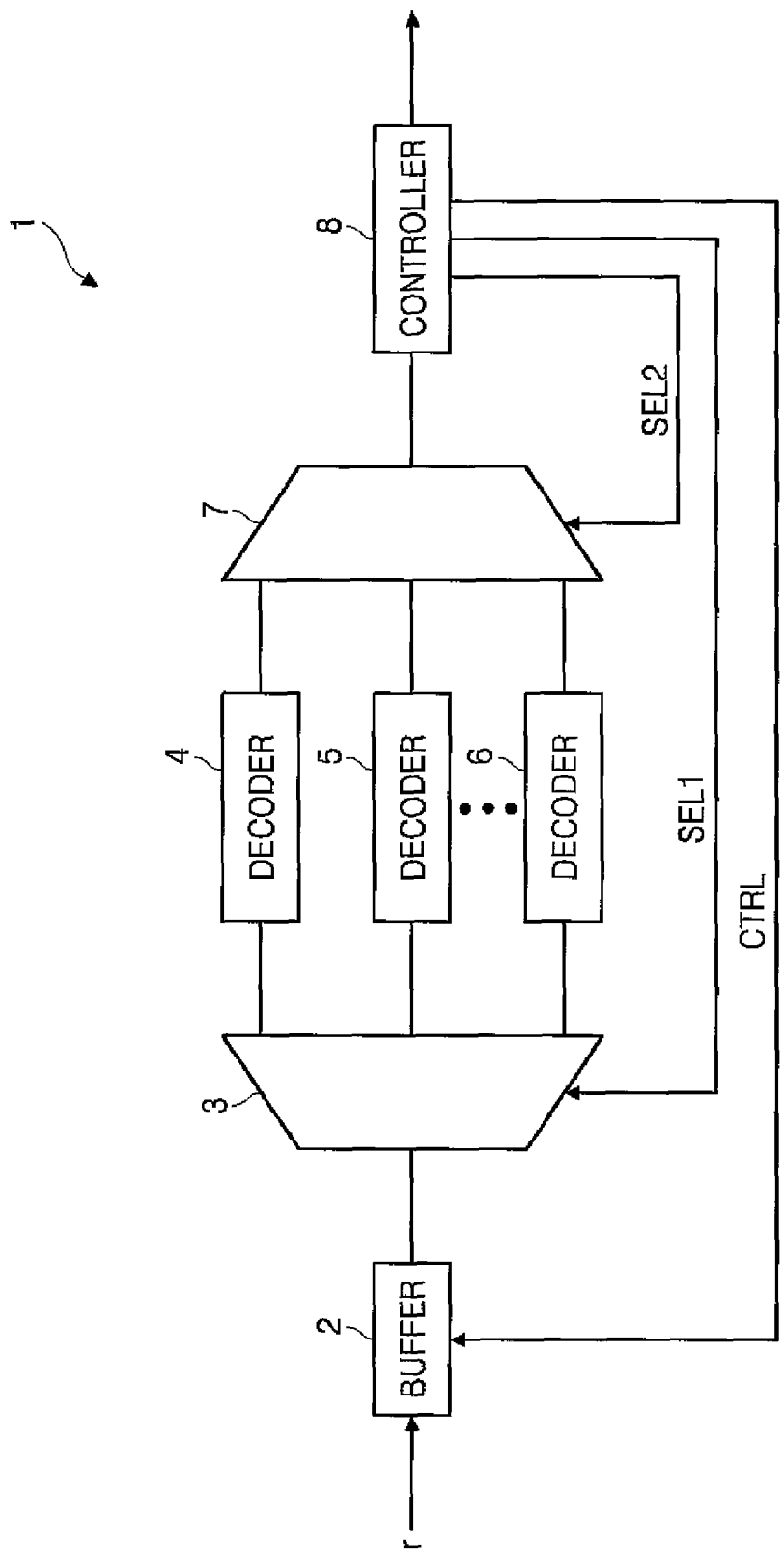
FIG. 1 is block diagram of a decoder, according to an embodiment of the present invention.

The present inventive concept will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

FIG. 1 is block diagram of a decoder 1, according to an illustrative embodiment of the present invention. Referring to FIG. 1, the decoder 1 includes a buffer 2, a first selector 3, multiple decoder stages (or decoding circuits) indicated by representative decoder stages 4 to 6, a second selector 7, and a controller 8. The buffer 2 buffers a received signal r sent through a channel (not shown) in response to a control signal CTRL output by the controller 8. The received signal r includes noise and a signal encoded by an encoder (not shown). The buffer 2 includes a memory capable of storing the received signal r.

The first selector 3 sends a signal output from the buffer 2 to any one of the decoder stages 4 to 6, in response to a first selection signal SEL1 output from the controller 8. In an embodiment, the first selector 3 may be a demultiplexer (DE-MUX), for example.

Each of the decoder stages 4 to 6 performs a decoding operation on the received signal r, according to a decoding algorithm or an iterative decoding algorithm having different computational complexities, with respect to the decoding algorithm and corresponding hardware and/or software. Each of the decoder stages 4 to 6 denotes a decoding apparatus or an error correction apparatus capable of decoding or error correction operations.

For example, the first decoder stage 4 may perform a decoding operation or an error correction operation on the received signal r using a decoding algorithm having the relatively lowest computational complexity, such as a bit-flipping algorithm. The second decoder stage 5 may perform a decoding operation or an error correction operation on the received signal r using a decoding algorithm having a relatively higher computational complexity than that of the first decoder stage 4, such as a sum-product algorithm or a min-sum algorithm, for example. The last decoder stage 6 may perform a decoding operation or an error correction operation on the received signal r using a decoding algorithm having the relatively highest computational complexity of the decoder stages 4 to 6.

The second selector 7 sends a decoded signal output from any one of the decoder stages 4 to 6 to the controller 8, in response to a second selection signal SEL2 output from the controller 8. In an embodiment, the second selector 7 may be a multiplexer (MUX), for example. The controller 8 analyzes the decoded signal output from the second selector 7 and determines whether the decoding of the received signal r has been successful. The controller 8 generates the control signal CTRL for controlling operation of the buffer 2, the first selection signal SEL1 for controlling operation of the first selector 3, and the second selection signal SEL2 for controlling the operation of the second selector 7, based on a result of the determination.

Figure 4:
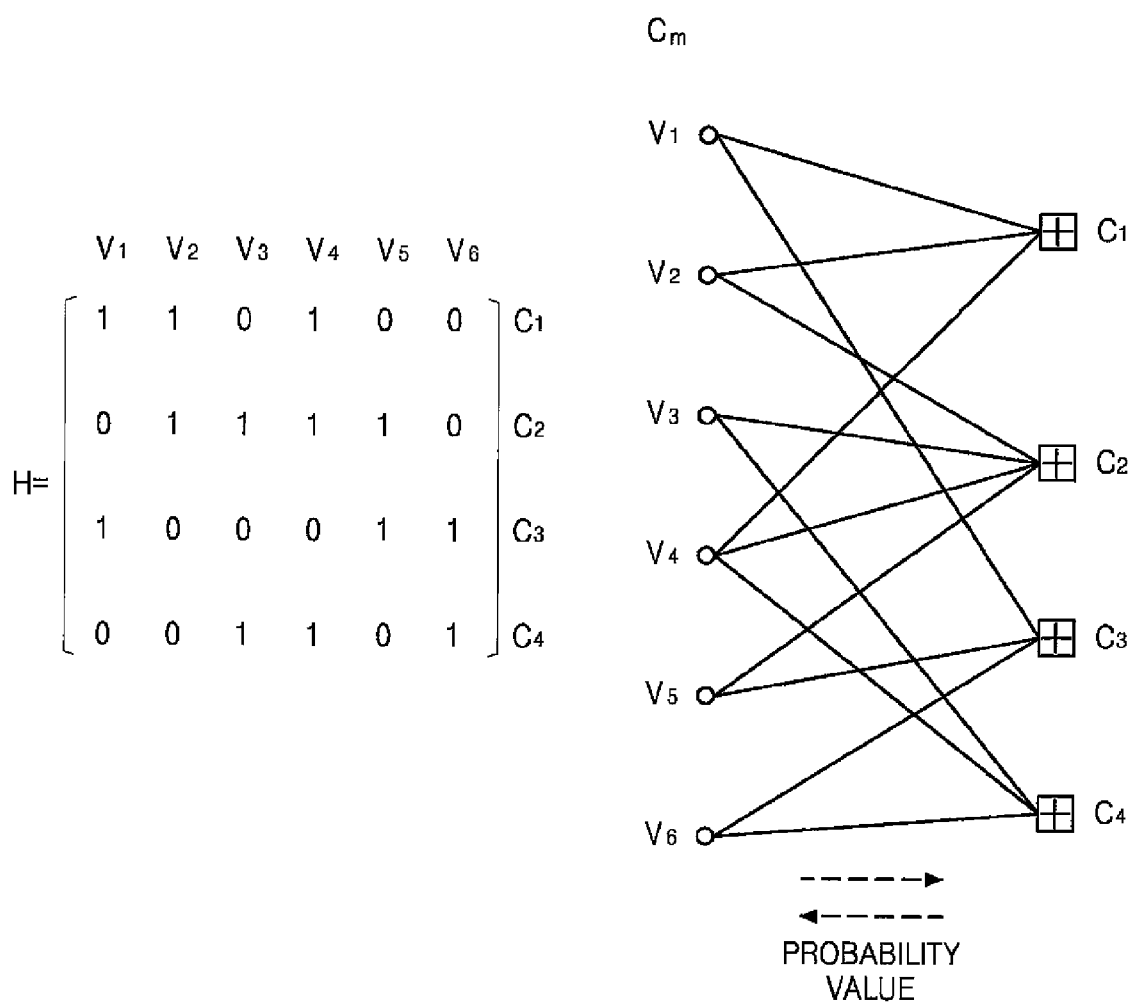
FIG. 4 illustrates an example of a general parity check matrix and bipartite graph.

For example, the controller 8 generates the control signal CTRL, the first selection signal SEL1, and the second selection signal SEL2 according to whether a syndrome value (or syndrome values) with respect to the decoded signal output from the second selector 7 is "0" or the decoded signal satisfies a parity check equation. The parity check equation will be described in detail with reference to FIG. 4.

For example, the buffer 2 stores the received signal r input through the channel in response to the control signal CTRL. The received signal r stored in the buffer 2 is sent to the first decoder stage 4 via the first selector 3, and controlled according to the first selection signal SEL1. The first decoder stage 4 performs a decoding operation or an error correction operation by applying a first decoding algorithm (e.g., a bit-flipping algorithm) on the received signal r, and outputs a decoded signal or an error corrected signal to the controller 8 via the second selector 7, controlled according to the second selection signal SEL2.

The controller 8 determines whether the decoding of the decoded signal output from the second selector 7 is a success or a failure. For example, the controller 8 may calculate the syndrome value with respect to the decoded signal output from the second selector 7 or the number of check nodes that do not satisfy the parity check equation. When the calculated the syndrome value or the number of check nodes that do not satisfy the parity check equation is "0", indicating that the decoding operation by the first decoder stage 4 is successful, the decoder 1 terminates the decoding operation under control of the controller 8.

However, when the syndrome value or the number of check nodes that do not satisfy the parity check equation is not "0", indicating that the decoding operation by the first decoder stage 4 is unsuccessful, the received signal r stored in the buffer 2 is output to the first selector 3 in response to the control signal CTRL output from the controller 8. The first selector 3 sends the received signal r output from the buffer 2 to the second decoder stage 5, in response to the first selection signal SEL1 output from the controller 8.

The second decoder stage 5 performs a decoding operation or an error correction operation by applying a more computationally complex second decoding algorithm (e.g., a sum-product algorithm or a min-sum algorithm) on the received signal r, and outputs a decoded signal or an error corrected signal to the controller 8 via the second selector 7 controlled according to the second selection signal SEL2.

The controller 8 determines whether the decoding of the decoded signal output from the second selector 7 is a success or a failure. For example, the controller 8 calculates the syndrome value with respect to the decoded signal output from the second selector 7 or the number of check nodes that do not satisfy the parity check equation. When the calculated syndrome value or number of check nodes that do not satisfy the parity check equation is "0", indicating that the decoding operation by the second decoder stage 5 is successful, the decoder 1 terminates the decoding operation under control of the controller 8.

However, when the syndrome value or the number of check nodes that do not satisfy the parity check equation is not "0", indicating that the decoding operation by the second decoder stage 5 is unsuccessful, the received signal r stored in the buffer 2 is output to the first selector 3 in response to the control signal CTRL output from the controller 8. The first selector 3 sends the received signal r output from the buffer 2 to a decoder stage having a higher computational complexity than that of the second decoder stage 5 (e.g., the third decoder stage 6) in response to the first selection signal SEL1 output from the controller 8.

As described above, when the decoding operation of the received signal r by a decoder stage having a relatively lower computational complexity is unsuccessful, the decoder 1 according to the present embodiment performs the decoding operation of the received signal r using a decoder stage having a relatively higher computational complexity. Finally, when the decoding operations of the received signal r by all decoder stages other than the decoder stage 6 having the highest computational complexity are unsuccessful, the decoder 1 according to the present embodiment performs the decoding operation of the received signal r using the decoder stage 6 having the highest computational complexity.

In other words, the success or failure of the decoding by each decoder stage determines whether to perform a decoding operation by another decoder stage having a higher computational complexity. The decoder 1 of FIG. 1 may be used as a receiving unit in any of a variety of applications, including a digital video broadcast (DVB) system, a digital satellite broadcast system, an Intelsat communications system, a space telemetry system, a wireless broadcast system, an asymmetric digital subscriber line (ADSL) transceiver, or a data storage and retrieval system, for example.

Figure 2:
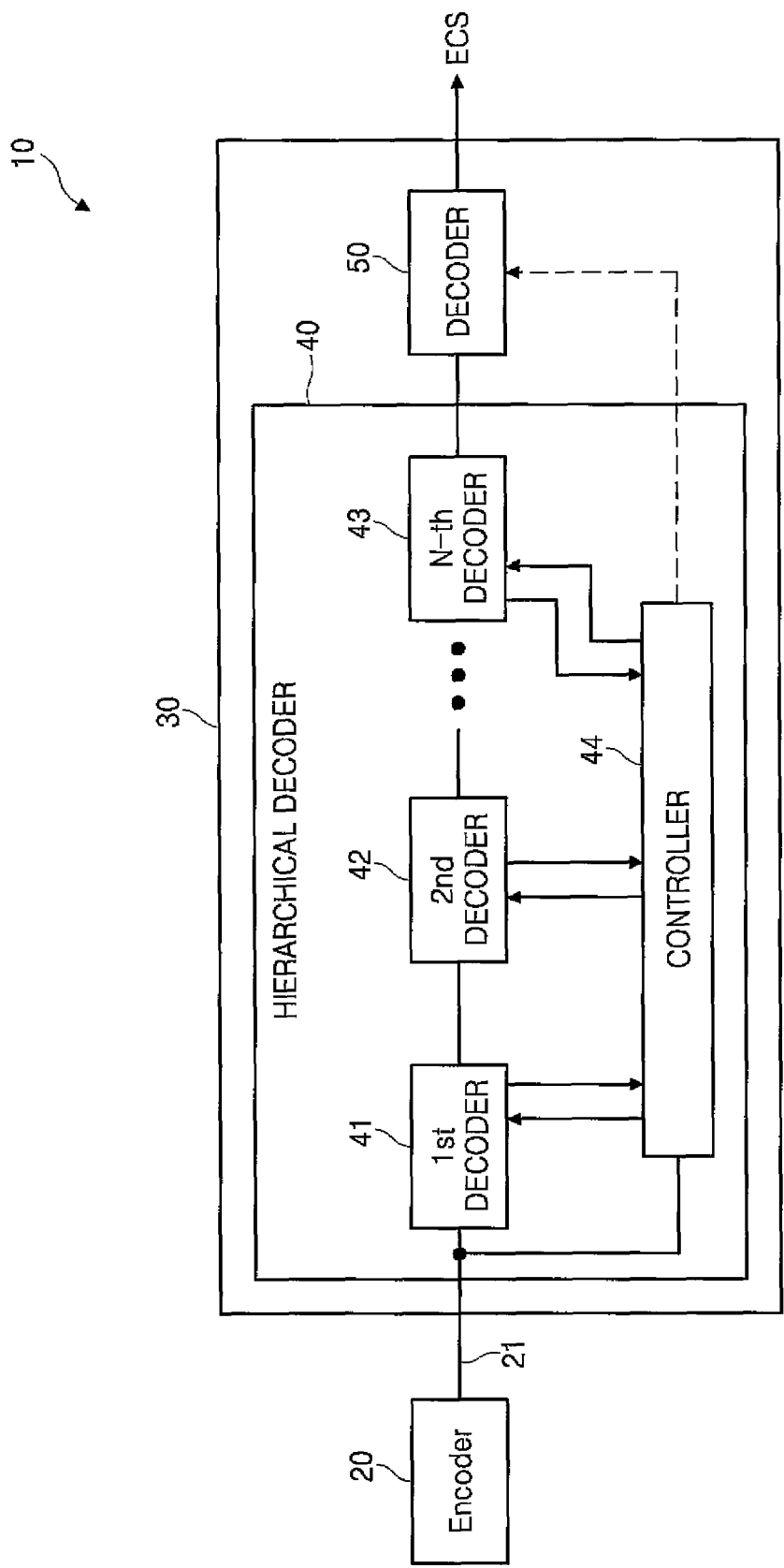
FIG. 2 is a block diagram of an error correction system including a hierarchical decoder, according to an embodiment of the present invention.

FIG. 2 is a block diagram of an error correction system 10 including a hierarchical decoder, according to an illustrative embodiment of the present invention. As discussed with respect to FIG. 1, the error correction system 10 according to the present embodiment may be used in a DVB system, a digital satellite broadcast system, an Intelsat communications system, a space telemetry system, a wireless broadcast system, an ADSL transceiver, a data storage and retrieval system, or the like.

The error correction system 10 includes an encoder 20 and a decoder or error correction apparatus 30, which are connected to each other via a channel 21. Thus, the decoder 30 may be used, for example, as a receiving unit of a DVB system, a digital satellite broadcast system, an Intelsat communications system, a space telemetry system, a wireless broadcast system, an ADSL transceiver, a data storage and retrieval system, or the like. The decoder 30 includes a hierarchical decoder 40 and an outer decoder stage 50. The hierarchical decoder 40 includes multiple decoder stages, indicated by representative decoder stages 41 to 43, which are hierarchically or serially connected to one another. The hierarchical decoder 40 may further include a controller 44.

The decoder stages 41 to 43 perform decoding operations or error correction operations with respect to a received signal using decoding algorithms having different computational complexities, respectively. Also, each of the decoder stages 41 to 43 has a different BER performance, and performs a decoding operation or an error correction operation with respect to the received signal using an iterative decoding algorithm. In this case, the decoder 30 may be used for an error correction operation using an iterative decoding method, including a low density parity check (LDPC) code, a repeat accumulate (RA) code, or a zigzag code, for example.

In the depicted embodiment, the computational complexity of the second decoder stage 42 (e.g., the computational complexity of decoding algorithm software and/or hardware) is higher than that of the first decoder stage 41. Likewise, the computational complexity of a third decoder stage (not shown) (e.g., the computational complexity of decoding algorithm software and/or hardware) is higher than that of the second decoder stage 42. The computational complexity of an N-th decoder stage 43, where N is a natural number greater than 1 (e.g., the computational complexity of decoding algorithm software and/or hardware) is higher than that of an (N-1)th decoder stage (not shown). That is, for each consecutive decoder stage, the computational complexity of a corresponding decoding algorithm used by the decoder stage increases. In other words, as the decoder stage increases, the corresponding error correction capability increases.

Each of the decoder stages 41, 42, ..., 43 includes a syndrome calculation circuit (not shown) for calculating syndrome values of a decoding result or the number of syndrome values that is not "0". The syndrome calculation circuit sends a result of the calculation to the controller 44. Also, each of the decoder stages 41, 42, ..., 43 includes a check node calculation circuit (not shown) for calculating the number of check nodes satisfying a parity check equation. For example, the parity check equation may be $H \cdot c^T = 0$, in which a parity check matrix H is applied to decoding result c. The check node calculation circuit sends a result of the calculation to the controller 44.

The iterative decoding algorithm of a decoder stage may be a sum-product algorithm or a min-sum algorithm, for example. The iterative decoding algorithm may be represented by a bipartite graph, such as a factor graph or Tanner graph of FIG. 4, determined by the position and number of "1s" in the parity check matrix H. Two types of variables are assigned to nodes of the bipartite graph, including a bit node and a check node. The bit node, or variable node, has a probability value $C_m$ (e.g., a log likelihood ratio (LLR) value).

The controller 44 may estimate the state of the channel 21 according to the BER of a received signal input through the channel 21 or the distribution of memory cells in a flash memory device (not shown), and control enabling/disabling of each of the decoder stages 41, 42, ..., 43 according to a result of the estimation. Also, the controller 44 may control enabling/disabling of each of the decoder stages 42 to 43 according to a result of a determination of whether the decoding of each of the decoder stages 41 to 43 is successful.

In various embodiments, the controller 44 may be a control logic circuit, for example, implemented as hardware, software and/or firmware, or any combination thereof, for controlling operation of each of the decoder stages 41 to 43, and the outer decoder stage 50.

Also, in various embodiments, the outer decoder stage 50 may be implemented, for example, as a Reed-Solomon decoder (stage), a Reed-Muller (RM) decoder (stage), or a Bose-Chadhuri-Hocquenghem (BCH) decoder (stage). The controller 44 may estimate the state of the channel 21 according to the BER of a received signal input through the channel 21 or the distribution of memory cells in the flash memory device, and control enabling/disabling of the outer decoder stage 50 according to a result of the estimation. Also, the controller 44 may control enabling/disabling of the outer decoder stage 50 according to a result of a determination of whether the decoding of each of the decoder stages 41 to 43 is successful.

Figure 3:
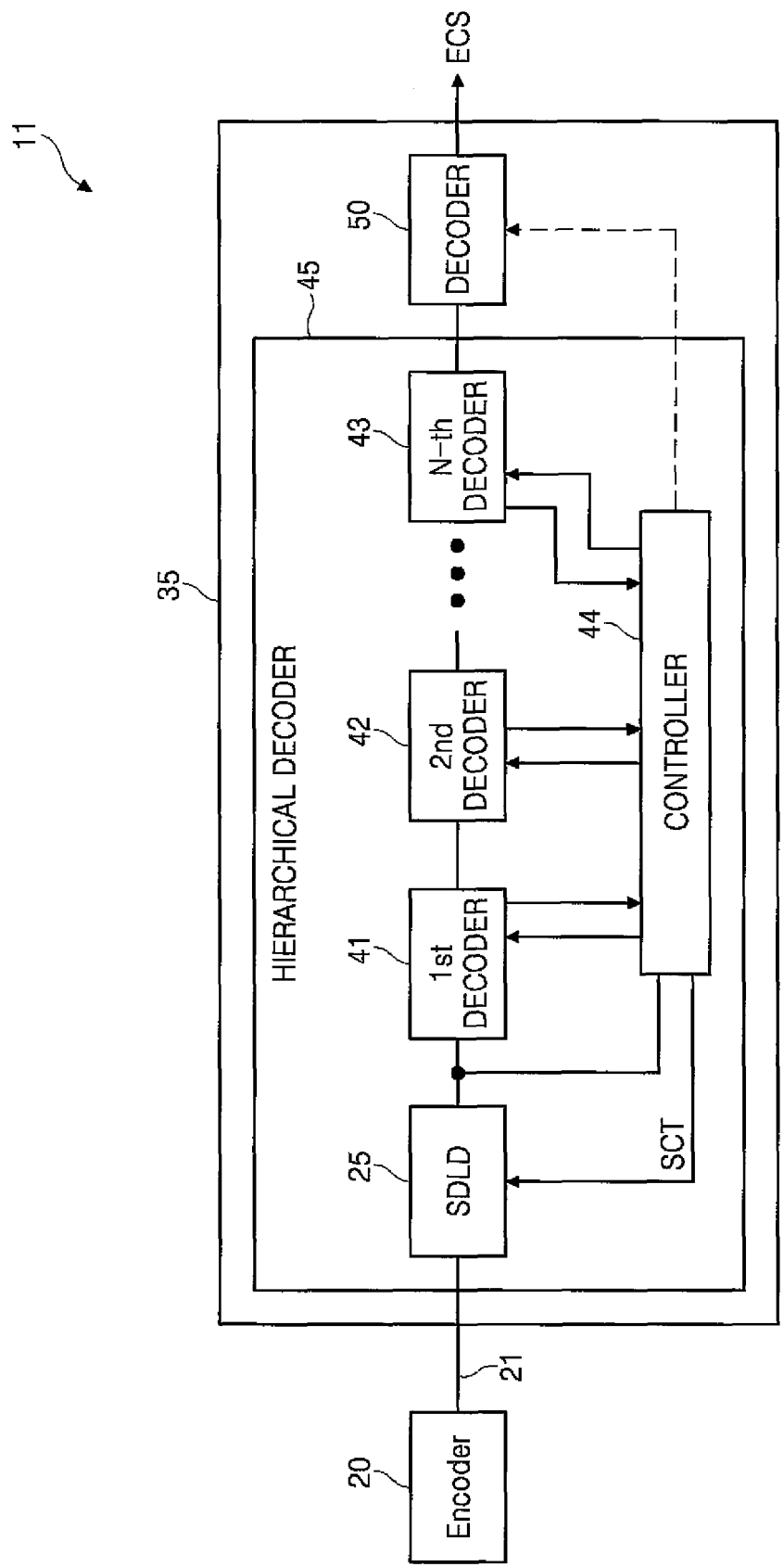
FIG. 3 is a block diagram of an error correction system including a hierarchical decoder, according to another embodiment of the present invention.

FIG. 3 is a block diagram of an error correction system 11 including a hierarchical decoder, according to another illustrative embodiment of the present invention. Referring to FIG. 3, a decoder 35 includes a hierarchical decoder 45 and an outer decoder stage 50. The hierarchical decoder 45 includes multiple decoder stages, indicated by representative decoder stages 41 to 43, which are hierarchically or serially connected to one another, and a controller 44, as discussed above with respect to decoder 30, as well as a soft decision level determination circuit 25. The soft decision level determination circuit 25 receives a received signal input through the channel 21, determines a soft decision level with respect to the received signal in response to a control signal SCT from the controller 44, and outputs soft decision values according to a result of the determination.

The control signal SCT output from the controller 44 may be determined according to whether the decoding of each of the decoder stages 41 to 43 is successful. For example, when the soft decision level determination circuit 25 makes an X-bit soft decision in response to the SCT, the soft decision level determination circuit 25 outputs soft decision values having $2^X$ levels. When the soft decision level increases, the performance of the decoder 35 improves.

For example, when the soft decision level determination circuit 25 determines a 2-bit soft decision level in response to the control signal SCT and outputs 4-level soft decision values as a result of the soft decision, each of the decoder stages 41 to 43 (and/or the controller 44) determines whether decoding is successful based on the 4-level soft decision values. The controller 44 controls enabling/disabling of each of the decoder stages 41 to 43 according to whether each decoding is successful.

When the decoding of a received signal by each of the decoder stages 41 to 43 is unsuccessful, the soft decision level determination circuit 25 determines a 3-bit soft decision level in response to the control signal SCT from the controller 44, and outputs 8-level soft decision values as a result of the soft decision.

The structure and operation of the decoder 35 of FIG. 3 are substantially the same as those of the decoder 30 of FIG. 2, except for the soft decision level determination circuit 25 and the additional control functionality of the controller 44. Operation of the decoder 35 of FIG. 3 will be described in more detail with reference to FIGS. 5-8.

Figure 5:
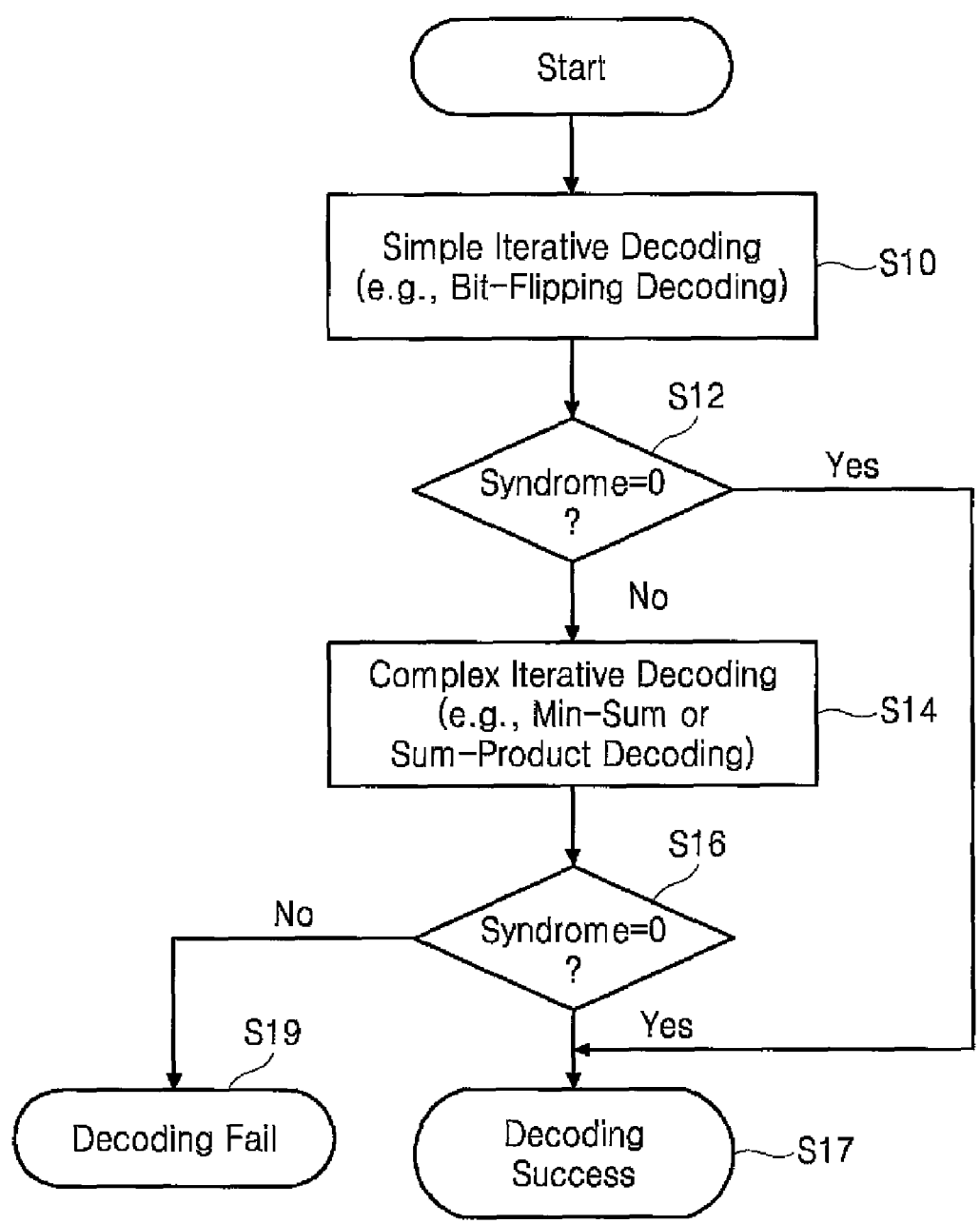
FIG. 5 is a flowchart showing a hierarchical decoding method, according to an embodiment of the present invention.

FIG. 5 is a flowchart showing a hierarchical decoding method, according to an illustrative embodiment of the present invention. Referring to FIGS. 2-5, a hierarchical decoding method, according to the present embodiment is described below. For convenience of explanation, it is assumed that the decoder 30 of FIG. 2 or the decoder 35 of FIG. 3 includes the first decoder stage 41 the second decoder stage 42, and the controller 44. "Signal" used in the following description denotes at least one signal.

Also, it is assumed that the first decoder stage 41, under control of the controller 44, performs a decoding operation or an error correction operation with respect to a received signal (as shown in FIG. 2) or a signal output from the soft decision level determination circuit 25 (as shown in FIG. 3) using an algorithm having a relatively low computational complexity (e.g., a bit-flipping algorithm), and the second decoder stage 42, under control of the controller 44, performs a decoding operation or an error correction operation with respect to a received signal or a signal output from the soft decision level determination circuit 25 using an algorithm having a computational complexity higher than that of the first decoder stage 41 (e.g., a sum-product algorithm or a min-sum algorithm).

When the decoding operation or the error correction operation begins, the controller 44 measures the BER of the received signal input through the channel 21 or the signal output from the soft decision level determination circuit 25, based on the received signal or the signal output from the soft decision level determination circuit 25. For example, when the state of the channel 21 is good, or when the received signal or the signal output from the soft decision level determination circuit 25 has a low BER, the controller 44 enables the first decode stage 41 and disables the second decoder stage 42.

The first decoder stage 41 performs a decoding operation or an error correction operation by applying a simple iterative decoding process, such as a bit-flipping algorithm, to the received signal input through the channel 21 or the signal output from the soft decision level determination circuit 25 (operation S10). The first decoder stage 41 calculates the syndrome values with respect to the decoded signal or the error corrected signal, or calculates the number of check nodes that do not satisfy the parity check equation, and determines whether the calculated syndrome values or number of check nodes that do not satisfy the parity check equation is "0" (operation S12).

When the calculated syndrome values or number of check nodes that do not satisfy the parity check equation is "0", the first decoder stage 41 outputs the decoded signal or the error corrected signal as a resulting decoded error corrected signal (ECS) of the ECS decoding process, and thus the decoding is successfully terminated (operation S17). The ECS may be output from the decoder 30 or 35, or another block shown in FIG. 2 or 3, in a variety of ways. For example, the ECS may be directly output from the first decoder stage 41, via the second decoder stage 42, or via the controller 44.

When it is determined that the calculated syndrome values or number of check nodes that do not satisfy the parity check equation is not "0" (operation S12), the syndrome calculation circuit or the check node calculation circuit of the first decoder stage 41 sends a result of the calculation to the controller 44. The controller 44 enables the second decoder stage 42 in response to the result of the calculation output from the syndrome calculation circuit or the check node calculation circuit of the first decoder stage 41.

The second decoder stage 42 performs a decoding operation or an error correction operation by applying a complex iterative decoding process, such as a sum-product algorithm or a min-sum algorithm, to the received signal input through the channel 21 or the signal output from the soft decision level determination circuit 25 (operation S14). The second decoder stage 42 calculates the syndrome values with respect to the decoded signal or the error corrected signal, or calculates the number of check nodes that do not satisfy the parity check equation, and determines whether the calculated syndrome values or number of check nodes that do not satisfy the parity check equation is "0" (operation S16).

When the calculated syndrome values or number of check nodes that do not satisfy the parity check equation is "0", the second decoder stage 42 outputs the decoded signal or the error corrected signal as the ECS, and thus the decoding is successfully terminated (operation S17). The ECS may be output from the decoder 30 or 35, or another block shown in FIG. 2 or 3, in a variety of ways. For example, the ECS may be directly output directly from the second decoder stage 42 or via the controller 44. However, when it is determined that the calculated syndrome values or number of check nodes that do not satisfy the parity check equation is not "0" (operation S16), the decoding is terminated as a failure (operation S19).

As described above with reference to FIGS. 2-5, when the state of the channel 21 is good, or when the received signal or the signal output from the soft decision level determination circuit 25 has a low BER, the decoder 30 or 35 performs a decoding operation or an error correction operation primarily using the first decoder stage 41, which executes an algorithm having relatively low computational complexity, such as a single bit-flipping algorithm or a multi-bit-flipping algorithm. When the decoding operation of the first decoder stage 41 with respect to the received signal or the signal output from the soft decision level determination circuit 25 is unsuccessful, the decoder 30 or 35 performs the decoding operation or the error correction operation using the second decoder stage 42. That is, the decoding operation of the second decoder stage 42 is determined based on whether the decoding operation of the first decoder stage 41 is successful.

However, when the state of the channel 21 is poor, or when the received signal or the signal output from the soft decision level determination circuit 25 has a high BER, the decoder 30 or 35 may perform a decoding operation or an error correction operation sequentially using the first and second decoder stages 41 and 42 with respect to the received signal or the signal output from the soft decision level determination circuit 25.

Also, when the state of the channel 21 is poor, or when the received signal or the signal output from the soft decision level determination circuit 25 has a high BER, the decoder 30 or 35 may disable the first decoder stage 41 having a relatively low computational complexity and enable the second decoder stage 42 having a relatively high computational complexity, for example, based on a channel estimation result of the controller 44.

Figure 6:
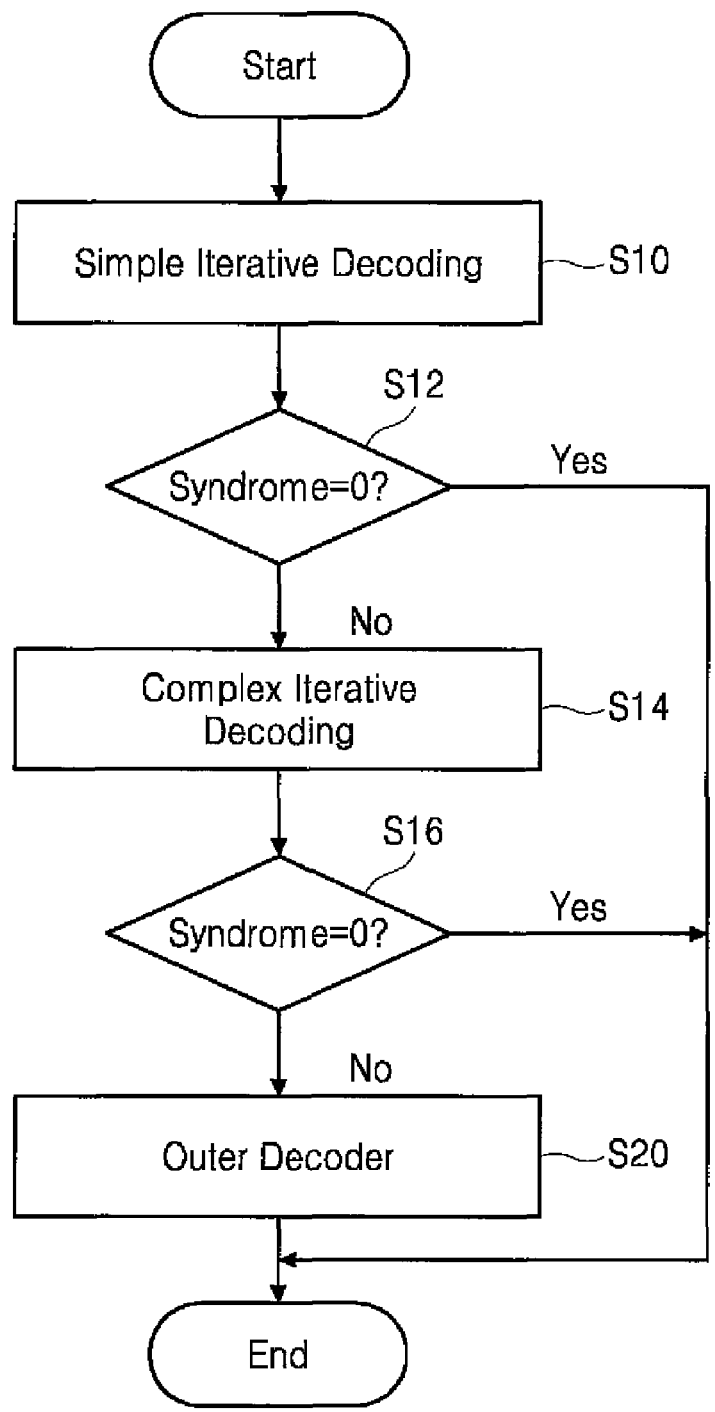
FIG. 6 is a flowchart showing a hierarchical decoding method, according to another embodiment of the present invention.

FIG. 6 is a flowchart showing a hierarchical decoding method, according to another illustrative embodiment of the present invention. Referring to FIGS. 2, 3 and 6, a hierarchical decoding method according to the present embodiment is described below. First, for convenience of explanation, it is assumed that the decoder 30 of FIG. 2 or decoder 35 of FIG. 3 includes the first decoder stage 41, the second decoder stage 42, the outer decoder stage 50 and the controller 44.

Also, it is assumed that the first decoder stage 41 performs a decoding operation or an error correction operation with respect to a received signal or the signal output from the soft decision level determination circuit 25 using an algorithm having a relatively low computational complexity, such as a bit-flipping algorithm, the second decoder stage 42 performs a decoding operation or an error correction operation with respect to a received signal or the signal output from the soft decision level determination circuit 25 using an algorithm having a computational complexity higher than that of the first decoder stage 41, such as a sum-product algorithm or a min-sum algorithm, and the outer decoder stage 50 performs a decoding operation or an error correction operation with respect to a received signal or the signal output from the soft decision level determination circuit 25.

In the hierarchical decoding method of FIG. 6, unlike the hierarchical decoding method of FIG. 5, when the decoding operation of the second decoder stage 42 with respect to the received signal or the signal output from the soft decision level determination circuit 25 is unsuccessful, the decoding operation or the error correction operation is performed once again with respect to the received signal or the signal output from the soft decision level determination circuit 25 using the outer decoder stage 50.

For purposes of explanation, it is assumed that operations S10 through S16 of FIG. 6 are substantially the same as discussed with respect to FIG. 5. That is, when the decoding operation performed of the first decoder stage 41 with respect to the received signal or the signal output from the soft decision level determination circuit 25 is unsuccessful (operations S10 and S12), e.g., according to the state of the channel 21, the decoder 30 or 35, under control of the controller 44, performs a decoding operation or an error correction operation with respect to the received signal or the signal output from the soft decision level determination circuit 25 using the second decoder stage 42. When the decoding operation of the second decoder stage 42 with respect to the received signal or the signal output from the soft decision level determination circuit 25 is unsuccessful (operations S14 and S16), the decoder 30 or 35, under control of the controller 44, performs the decoding operation or the error correction operation with respect to the received signal or the signal output from the soft decision level determination circuit 25 using the outer decoder stage 50 (operation S20).

Also, in an embodiment, when the decoding operation of the first decoder stage 41 is unsuccessful, according to the state of the channel 21, the decoder 30 or 35, under control of the controller 44, may disable the second decoder stage 42 and perform the decoding operation or the error correction operation with respect to the received signal or the signal output from the soft decision level determination circuit 25 using the outer decoder stage 50.

Similarly, according to the state of the channel 21, the decoder 30 or 35, under control of the controller 44, may omit the decoding operation by the first decoder stage 41 and perform the decoding operation or the error correction operation with respect to the received signal or the signal output from the soft decision level determination circuit 25 using the second decoder stage 42. When the decoding operation of the second decoder stage 42 with respect to the received signal or the signal output from the soft decision level determination circuit 25 is unsuccessful, the decoder 30 or 35 may perform the decoding operation or the error correction operation with respect to the received signal or the signal output from the soft decision level determination circuit 25 using the outer decoder stage 50.

Also, according to the state of the channel 21, the decoder 30 or 35, under control of the controller 44, may omit the decoding operations by the first and second decoder stages 41 and 42 altogether, and perform the decoding operation or the error correction operation with respect to the received signal or the signal output from the soft decision level determination circuit 25 using the outer decoder stage 50.

Figure 7:
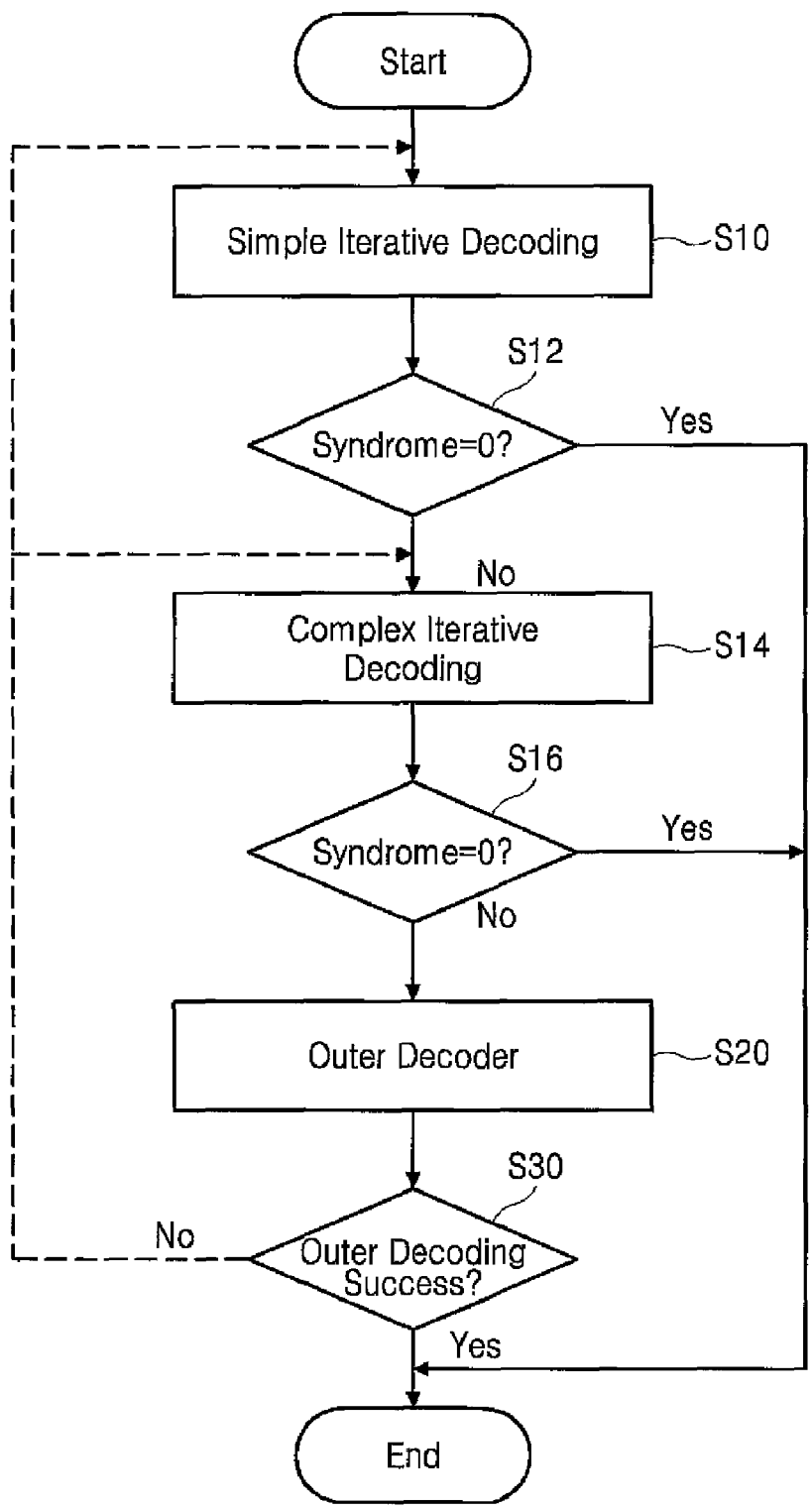
FIG. 7 is a flowchart showing a hierarchical decoding method, according to another embodiment of the present invention.

FIG. 7 is a flow diagram showing a hierarchical decoding method, according to another illustrative embodiment of the present invention. Referring to FIG. 7, when the decoding operation or the error correction operation with respect to the received signal or the signal output from the soft decision level determination circuit 25 is unsuccessful, the decoding operation or the error correction operation with respect to the received signal or the signal output from the soft decision level determination circuit 25 is repeatedly performed under control of the controller 44.

For purposes of explanation, it is assumed that operations S10 through S20 of FIG. 7 are substantially as discussed with respect to FIG. 6. However, when it is determined that the decoding operation or the error correction operation of the outer decoder stage 50 with respect to the received signal or the signal output from the soft decision level determination circuit 25 is unsuccessful (operation S30), the decoder 30 or 35, under control of the controller 44, sequentially repeats operations S10 to S20 or operations S14 to S20 with respect to the received signal or the signal output from the soft decision level determination circuit 25.

When it is determined that the decoding operation or the error correction operation of the outer decoder stage 50 is successful (operation S30), the decoding operation of the decoder 30 or 35 is terminated. Thus, the hierarchical decoding method, according to the present embodiment, improves the overall error correction capability of the decoder 30 or 35.

Figure 8:
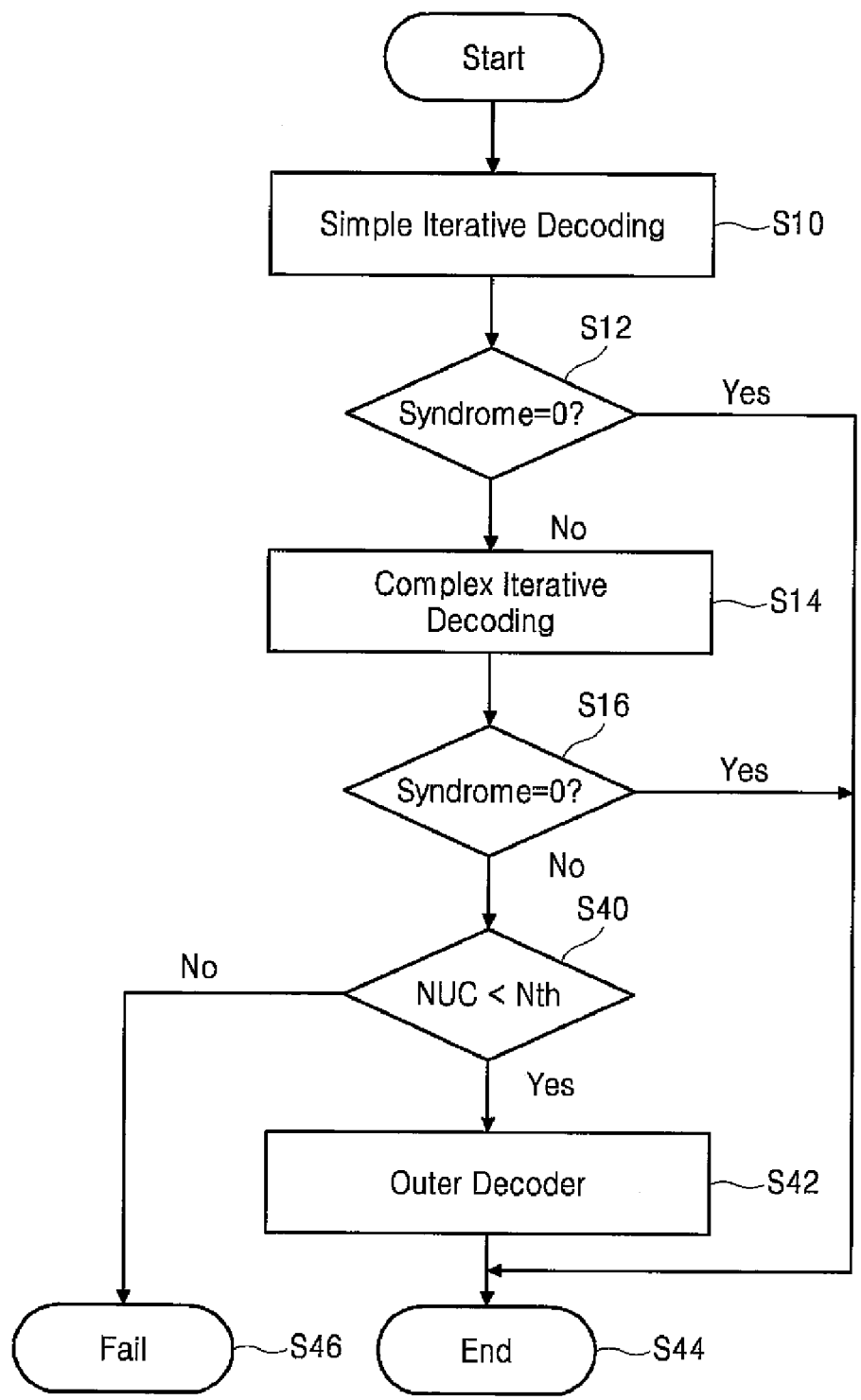
FIG. 8 is a flowchart showing a hierarchical decoding method, according to another embodiment of the present invention.

FIG. 8 is a flowchart showing a hierarchical decoding method, according to another illustrative embodiment of the present invention. The method of FIG. 8 includes comparing a reference number with either the syndrome values that are not "0" or the number of check nodes that do not satisfy the parity check equation that are not "0", calculated by the syndrome calculation circuit or the check node calculation circuit of the second decoder stage 42, respectively. Whether to perform further decoding operations with respect to the received signal or the signal output from the soft decision level determination circuit 25 using the outer decoder stage 50 is determined according to a result of the comparison.

For purposes of explanation, it is assumed that operations S10 through S16 of FIG. 8 are substantially the same as discussed with respect to FIG. 5 or 6. However, when the syndrome values or the number of check nodes that do not satisfy the parity check equation is not "0" (operation S16), as calculated by the syndrome calculation circuit or the check node calculation circuit of the second decoder stage 42, the second decoder stage 42 sends the syndrome values or the number of check nodes that do not satisfy the parity check equation to the controller 44.

The controller 44 compares the number NUC of the syndrome values that are not "0", or the number NUC of check nodes that do not satisfy the parity check equation that are not "0", with reference number Nth (operation S40). When the number NUC is smaller than the reference number Nth, the controller 44 enables the outer decoder stage 50. Thus, the outer decoder stage 50 performs a decoding operation with respect to the received signal or the signal output from the soft decision level determination circuit 25 (operation S42). Then, the decoding operation is terminated (operation S44). However, when the number NUC is not less than the reference number Nth, the controller 44 does not enable the outer decoder stage 50 and terminates the decoding operation as a failure (operation S46).

As described above, since the decoder 30 or 35 used as a receiver for a communication system or a data storage system may estimate the state of a channel through which the received signal or the signal output from the soft decision level determination circuit 25 is sent, and hierarchically perform at least one of multiple hierarchical decoding algorithms according to a result of the estimation, processing, decoding delay time and power consumption are reduced. Thus, the error correction capability or BER performance of the decoder 30 or 35 is improved.

The decoder 30 or 35 according to the various embodiments may perform a decoding operation with respect to a received signal not only using decoding algorithms having different computation complexities, but also using different soft decision levels. Thus, the decoding performance of the decoder 30 or 35 is improved.

As described above, since the hierarchical decoding apparatus according to the various embodiments may apply at least one of a variety of decoding algorithms based on a result of decoding a received signal, the processing, decoding delay time and power consumption are reduced. Therefore, the hierarchical decoding apparatus may also have a reduced overall BER.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A decoder comprising:
a plurality of decoder stages performing decoding operations with respect to a received signal using a corresponding plurality of different decoding algorithms, respectively; and
a controller determining whether the decoding operation performed by one decoder stage of the plurality of decoder stages with respect to the received signal is successful, and controlling the decoding operation of each of the other decoder stages in response to a result of the determination,
wherein the controller enables another one of the plurality of decoder stages when the decoding operation performed by the one of the plurality of decoder stages with respect to the received signal is not successful.

2. The decoder of claim 1, wherein the controller calculates a syndrome value with respect to a signal decoded by the one decoder stage, determines whether the decoding operation is successful based on the calculated syndrome value, and controls the decoding operation of each of the other decoder stages based on a result of the determination.

3. The decoder of claim 1, further comprising:
a demultiplexer sending the received signal to the one decoder stage in response to a first selection signal; and
a multiplexer sending an output signal of the one decoder stage in response to a second selection signal;
wherein the controller determines whether the decoding operation performed by the one decoder stage is successful in response to the output signal of the multiplexer, and generates the first and second selection signals based on the result of the determination.

4. The decoder of claim 3, further comprising:
a buffer storing the received signal and sending the stored received signal to the demultiplexer in response to a control signal generated based on the determination result of the controller.

5. The decoder of claim 3, wherein the controller calculates a syndrome value with respect to the output signal of the multiplexer, determines whether the decoding operation of the one decoder stage is successful based on the calculated syndrome value, and controls the decoding operation of each of the other decoder stages based on a result of the determination.

6. A decoder comprising:
a controller estimating a state of a channel through which a received signal is sent; and
N decoder stages, where N is a natural number, each decoder stage performing a decoding operation with respect to the received signal using a decoding algorithm different from decoding algorithms of another decoder stage respectively,
wherein the controller enables the decoding operation of one of the decoder stages and disables the decoding operations of another one of the decoder stages, based on the estimated state of the channel.

7. The decoder of claim 6, wherein the controller estimates the state of the channel based on a bit error rate (HER) of the received signal.

8. The decoder of claim 6, wherein the controller estimates the state of the channel based on distribution of a plurality of memory cells stored in a flash memory device.

9. The decoder of claim 6, further comprising:
an outer decoder stage among the N decoder stages comprising one of a Reed-Solomon decoder stage, a Reed-Muller (RM) decoder stage, or a Bose-Chadhuri-Hocquenghem (BCH) decoder stage, performing a decoding operation with respect to the received signal.

10. The decoder of claim 6, further comprising:
a soft decision level determination circuit determining a soft decision level with respect to the received signal, in response to a control signal generated by the controller, and outputting a plurality of soft decision values according to a result of the determination,
wherein the controller estimates the state of the channel based on the soft decision values.

11. The decoder of claim 10, wherein the controller generates the control signal in response to a signal indicating whether at least one of the decoding operations of the N decoder stages is successful.

12. A decoder comprising:
a controller estimating a state of a channel through which a received signal is sent;
a first decoder stage performing a decoding operation with respect to the received signal using a first decoding algorithm; and
a second decoder stage performing a decoding operation with respect to the received signal using a second decoding algorithm,
wherein the controller enables the decoding operation of one of the first and second decoder stages and disables the decoding operation of the other one of the first and second decoder stages, based on an estimated state of the channel.

13. The decoder of claim 12, wherein the controller estimates the state of the channel based on a bit error rate of the received signal.

14. The decoder of claim 12, wherein the controller controls whether the decoding operation of the second decoder stage is performed, according to whether the decoding operation performed by the first decoder stage with respect to the received signal is successful.

15. The decoder of claim 12, wherein a computational complexity of the first decoding algorithm is lower than a computational complexity of the second decoding algorithm.

16. The decoder of claim 12, wherein the first decoding algorithm comprises a bit-flipping decoding algorithm, and the second decoding algorithm comprises one of a sum-product algorithm and a min-sum algorithm.

17. The decoder of claim 12, wherein the first decoding algorithm comprises a min-sum algorithm and the second decoding algorithm comprises a sum-product algorithm.

18. The decoder of claim 12, further comprising:
a third decoder stage performing a decoding operation with respect to the received signal, the third decoder stage comprising one of a Reed-Solomon (RS) decoder stage, a Reed-Muller (RM) decoder stage, or a Bose-Chadhuri-Hocquenghem (BCH) decoder stage,
wherein the controller controls the decoding operation of the third decoder stage based on the estimated state of the channel.

19. The decoder of claim 18, wherein the controller further controls the decoding operation of the third decoder stage according to whether the decoding operation with respect to the received signal performed by the first decoder stage is successful or the decoding operation with respect to the received signal performed by the second decoder stage is successful.

20. The decoder of claim 18, wherein the controller compares a reference value with a syndrome value calculated by a syndrome calculation circuit of the second decoder stage and further controls the decoding operation of the third decoder stage based on a result of the comparison.

21. A decoder comprising:
a first selector configured to receive an encoded signal and pass the encoded signal to a plurality of decoder stages, wherein the plurality of decoder stages is arranged in parallel between the first selector and a second selector and comprises;
a first decoder stage configured to perform a first decoding operation on the encoded signal to generate a first decoder stage output,
a second decoder stage configured to perform a second decoding operation on the encoded signal to generate a second decoder stage output, wherein the second decoding operation is more computationally complex than the first decoding operation, and
a third decoder stage configured to perform a third decoding operation on the encoded signal to generate a third decoder stage output, wherein the third decoding operation is more computationally complex than the second decoding operation;
wherein the first selector passes at any given time the encoded signal to only one of the first, second and third decoder stages in response to a first selection signal, and the second selector being configured at any given time to receive and pass as an decoded signal only one of the first, second, and third decoder stage outputs in response to a second selection signal; and
a controller configured to receive the decoded signal and analyze the decoded signal to determine whether the one of the first, second and third decoding operations performed by the plurality of decoder stages on the encoded signal is successful, and generating the first and second selection signals in response to a result of the determination.

22. The decoder of claim 21, wherein the controller is further configured to determine whether the one of the first, second and third decoding operations performed by the plurality of decoder stages on the encoded signal is successful by calculating a syndrome value for the decoded signal.

23. The decoder of claim 21, wherein the first decoding operation applies a bit-flipping algorithm to the encoded signal to generate the first decoder stage output.

24. The decoder of claim 21, wherein the second decoding operation applies a sum-product algorithm to the encoded signal to generate the second decoder stage output.

25. The decoder of claim 21, wherein the second decoding operation applies a min-sum algorithm to the encoded signal to generate the second decoder stage output.

26. The decoder of claim 21, wherein the controller is further configured to:
- generate the first and second selections signal such that the first decoder stage performs the first decoding operation on the encoded signal to generate the first decoder stage output and receive the first decoder stage output as the decoded signal; and then,
- analyze a syndrome value for the decoded signal to determine whether the first decoding operation is successful;
- upon determining that the first decoding operation is not successful, the controller is further configured to:
- generate the first and second selections signal such that the second decoder stage performs the second decoding operation on the encoded signal to generate the second decoder stage output and receive the second decoder stage output as the decoded signal; and then,
- analyze the syndrome value for the decoded signal to determine whether the second decoding operation is successful.

27. The decoder of claim 26, wherein the controller is further configured to:
- upon determining that the first and second decoding operations are not successful,
- generate the first and second selections signal such that the third decoder stage performs the third decoding operation on the encoded signal to generate the third decoder stage output and receive the third decoder stage output as the decoded signal; and then,
- analyze the syndrome value for the decoded signal to determine whether the third decoding operation is successful.

* * * * *